United States Patent
Lin et al.

(10) Patent No.: US 9,299,680 B2
(45) Date of Patent: Mar. 29, 2016

(54) INTEGRATED CIRCUIT STRUCTURE HAVING DIES WITH CONNECTORS

(71) Applicant: Taiwan Semiconductor Manufacturing Company, Ltd., Hsin-Chu (TW)

(72) Inventors: Jing-Cheng Lin, Hsin-Chu (TW); Cheng-Lin Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 159 days.

(21) Appl. No.: 13/901,279

(22) Filed: May 23, 2013

(65) Prior Publication Data

US 2014/0264843 A1 Sep. 18, 2014

Related U.S. Application Data

(60) Provisional application No. 61/783,548, filed on Mar. 14, 2013.

(51) Int. Cl.
*H01L 23/00* (2006.01)
*H01L 23/29* (2006.01)
(Continued)

(52) U.S. Cl.
CPC .............. *H01L 24/81* (2013.01); *H01L 23/293* (2013.01); *H01L 23/3192* (2013.01); *H01L 24/13* (2013.01); *H01L 24/16* (2013.01); *H01L 25/0657* (2013.01); *H01L 25/50* (2013.01); *H01L 24/03* (2013.01); *H01L 24/05* (2013.01); *H01L 24/10* (2013.01); *H01L 24/11* (2013.01); *H01L 2224/0345* (2013.01); *H01L 2224/0346* (2013.01); *H01L 2224/0401* (2013.01); *H01L 2224/05572* (2013.01); *H01L 2224/05582* (2013.01); *H01L 2224/05647* (2013.01); *H01L 2224/1145* (2013.01); *H01L 2224/1146* (2013.01); *H01L 2224/11452* (2013.01); *H01L 2224/13005* (2013.01); *H01L 2224/13017* (2013.01); *H01L 2224/13018* (2013.01); *H01L 2224/13084* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/16058* (2013.01); *H01L 2224/16146* (2013.01); *H01L 2224/16238* (2013.01); *H01L 2224/16503* (2013.01); *H01L 2224/16507* (2013.01); *H01L 2224/73204* (2013.01); *H01L 2224/8181* (2013.01); *H01L 2224/81191* (2013.01);
(Continued)

(58) Field of Classification Search
CPC ....................................... H01L 23/48
USPC .......................................... 257/777
See application file for complete search history.

(56) References Cited

U.S. PATENT DOCUMENTS

2008/0223906 A1* 9/2008 Choi et al. ............... 228/125
2011/0001250 A1* 1/2011 Lin et al. .................. 257/778
(Continued)

*Primary Examiner* — William Harriston
(74) *Attorney, Agent, or Firm* — Slater & Matsil, L.L.P.

(57) ABSTRACT

An embodiment is an integrated circuit structure including a first die having a bump structure, and a second die having a pad structure. The first die is attached to the second die by bonding the bump structure and the pad structure. The bump structure includes a metal pillar, a metal cap layer on the metal pillar, a metal insertion layer on the metal cap layer, and a solder layer on the metal insertion layer. The pad structure includes at least one of a nickel (Ni) layer, a palladium (Pd) layer or a gold (Au) layer.

20 Claims, 2 Drawing Sheets

(51) Int. Cl.
*H01L 23/31* (2006.01)
*H01L 25/065* (2006.01)
*H01L 25/00* (2006.01)

(52) U.S. Cl.
CPC .............. *H01L2224/81815* (2013.01); *H01L 2225/06513* (2013.01); *H01L 2924/3656* (2013.01)

(56) References Cited

U.S. PATENT DOCUMENTS

2011/0006415 A1* 1/2011 Bachman et al. ............. 257/737
2011/0121442 A1* 5/2011 Shen et al. ................ 257/686
2011/0285023 A1* 11/2011 Shen et al. ................ 257/773

* cited by examiner

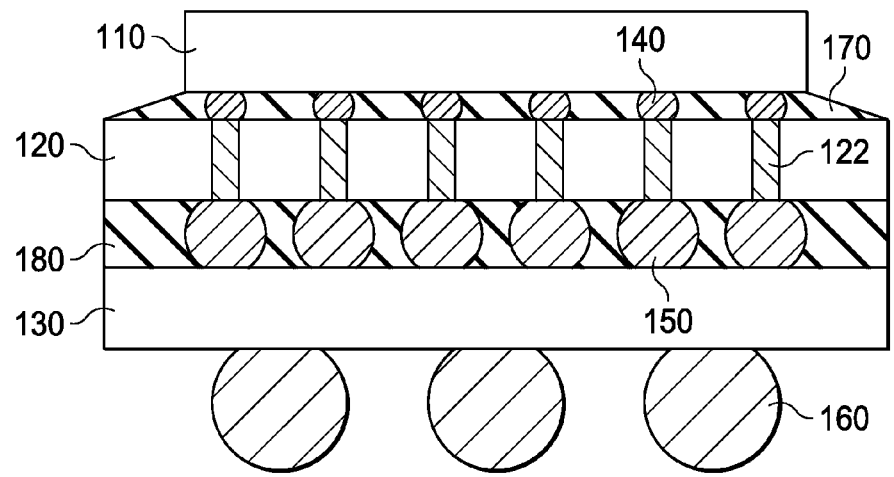
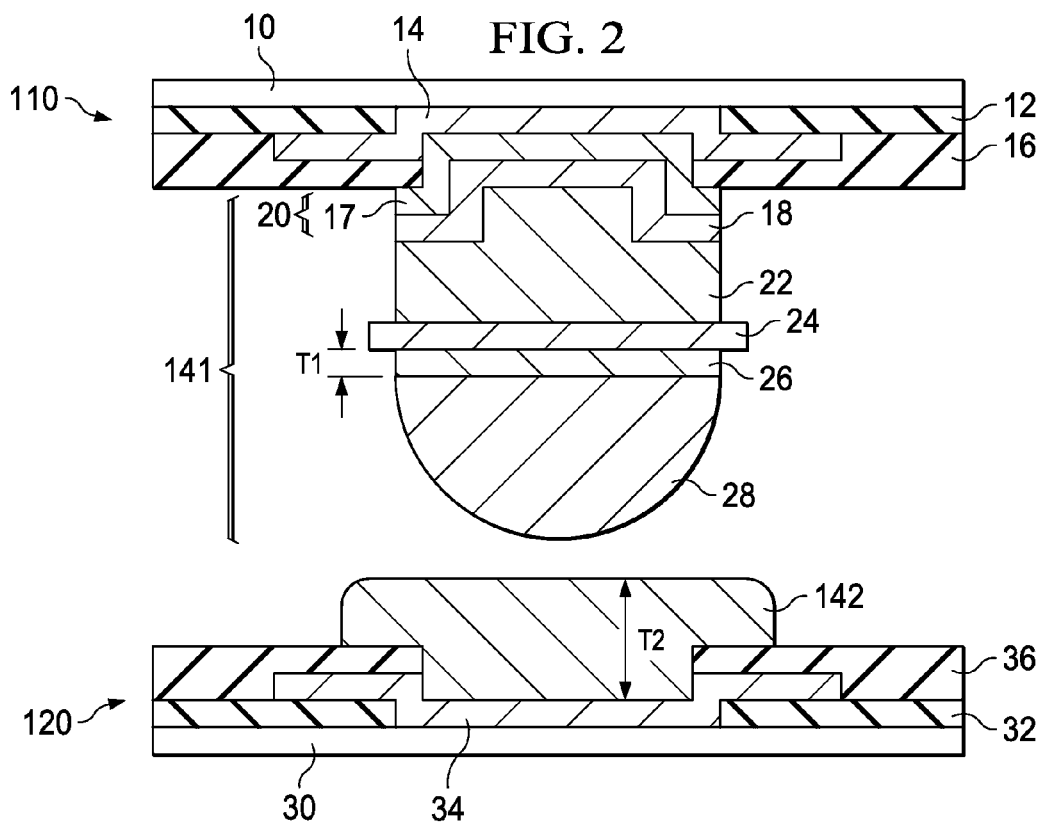

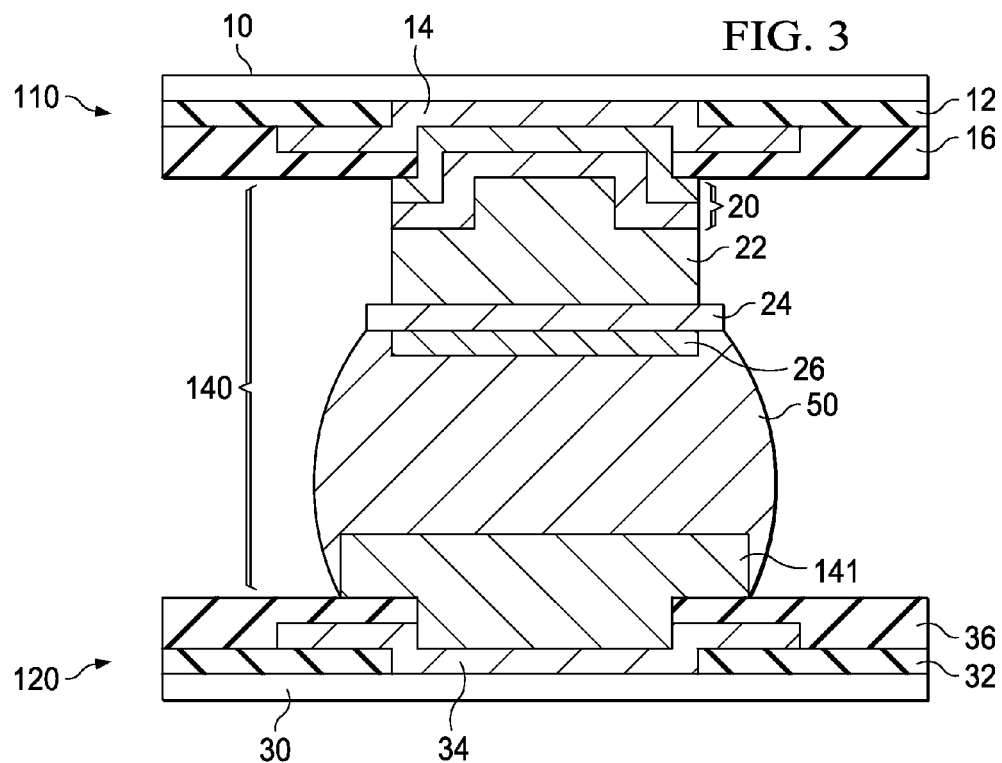
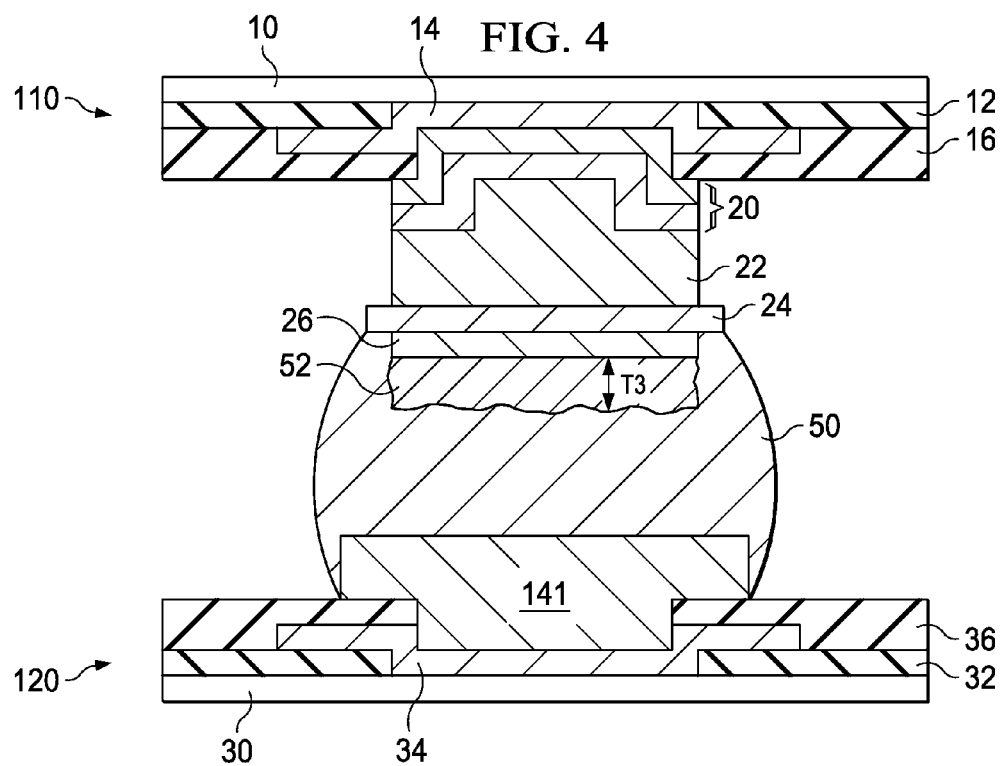

INTEGRATED CIRCUIT STRUCTURE HAVING DIES WITH CONNECTORS

This application claims priority to U.S. Provisional Application Ser. No. 61/783,548, filed on Mar. 14, 2013, entitled "Structure Having Dies with Connectors," which application is hereby incorporated herein by reference.

BACKGROUND

Since the development of the integrated circuit (IC), the semiconductor industry has experienced continued rapid growth due to continuous improvements in the integration density of various electronic components such as transistors, diodes, resistors, capacitors, and the like. For the most part, these improvements in integration density have come from repeated reductions in minimum feature size, which allows more components to be integrated into a given area. These integration improvements are essentially two-dimensional in nature, in that the area occupied by the integrated components is essentially on the surface of the semiconductor wafer. Various techniques have been developed to attempt to incorporate extra dimensionality into IC structures. One technique is referred to as a two and a half dimensional structure. These structures typically have interposers having a die stacked on the interposer. Interposers have been used to redistribute ball contact areas from that of the chip to a larger area of the interposer. Further, interposers have allowed for a package that includes multiple chips. Other techniques stack chips in a three dimensional (3D) structure. This allows for greater functionality with a reduced footprint of the structure.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 1 is a cross-sectional diagram illustrating an integrated circuit structure according to an embodiment;

FIG. 2 is a cross-sectional diagram illustrating bumps and pad structures on dies of an integrated circuit structure according to an embodiment;

FIG. 3 is a cross-sectional diagram illustrating a connector between dies of an integrated circuit structure according to an embodiment; and FIG. 4 is a cross-sectional diagram illustrating an intermetallic compound (IMC) layer in a connector of the integrated circuit structure according to an embodiment.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to integrated circuit structures, which can be two half dimensional integrated circuit (2.5DIC) structures, three dimensional integrated circuit (3DIC) structures or other structures.

FIG. 1 illustrates an integrated circuit structure 100 according to an embodiment. The structure 100 comprises a first die 110 and a second die 120 attached to each other by a plurality of first connectors 140, and a workpiece 130 attached to the second die 120 through a plurality of second connectors 150. The workpiece 130 includes a plurality of third connectors 160 formed on one side opposite to the side attached to the second die 120, for connecting other substrates or devices.

In some embodiments, the first die 110 is a die having a low density of inputs and outputs, such as a dynamic random access memory (DRAM) die, a memory stack of dies, a radio frequency signal processing die, or the like. In other embodiments, the first die 110 is a die having a high density of inputs or outputs, such as a graphics processing unit (GPU) die, a logic device die, or the like. In some embodiments, the second die 120 is an active die, such as a DRAM die, a radio frequency signal processing die, a logic device die, a GPU die, or the like. In an embodiment, the second die 120 is an interposer free of active devices. In an embodiment, the second die 120 includes through substrate vias (TSVs), also referred to as through silicon vias, 122 electrically connected to the first die 110 and/or the substrate 130. The sizes of the first die 110 and the second die 120 may be the same or different depending on varies in circuit designs and process flow controls. In embodiments, the workpiece 130 is a package substrate, an organic substrate, or a semiconductor substrate. In embodiments, a first underfill material 170 is between the first die 110 and the second die 120, and a second underfill material 180 is between the second die 120 and the substrate 130. It should be noted that the underfill materials 170 and 180 are optional in the integrated circuit structure 100.

In embodiments, bumps and/or pad structures are formed on the first die 110 and the second die 120, and the jointed bumps and/or pad structures form the first connectors 140 to provide electrical connection and physical support between the dies 110 and 120. In embodiments, the bumps formed on the dies 110 and/or 120 are micro bumps or controlled collapse chip connection (C4) bumps. One side of the workpiece 130 is attached to the second die 120 by the second connectors 150, such as C4 bumps, and the other side of the workpiece 130 has the third connectors 160, such as ball grid array (BGA) balls. In embodiments, a size and pitch of the third connectors 160 is larger than a size and a pitch of the second connectors 150, respectively. In embodiments, a size and pitch of the second connectors 150 is larger than a size and a pitch of the first connectors 140, respectively.

FIG. 2 illustrates the formation of the bumps and pad structures on the first die 110 and the second die 120 before attaching the first die 110 to the second die 120.

The first die 110 includes a first substrate 10, a first passivation layer 12 covering the first substrate 10, a post-passivation interconnect (PPI) layer 14 formed through an opening in the first passivation layer 12, a first protective layer 16 covering the first passivation layer 12 and a portion of the PPI layer 14, and a bump structure 141 over the first protective layer 16 electrically coupling the PPI layer 14.

An example of the first substrate 10 may include a semiconductor substrate as employed in a semiconductor integrated circuit fabrication, and integrated circuits may be formed therein and/or thereupon. The term semiconductor substrate contemplates any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The integrated circuits as used herein refer to electronic circuits having multiple individual circuit elements, such as transistors, diodes, resistors, capacitors, inductors, and other active and passive semiconductor devices. The substrate 10 further includes inter-layer dielectric layers and a metallization structure overlying the integrated circuits.

In embodiments, the first passivation layer 12 is formed of a non-organic material selected from un-doped silicate glass (USG), silicon nitride, silicon oxynitride, silicon oxide, and combinations thereof. In other embodiments, the first passivation layer 12 is formed of a polymer layer, such as an epoxy, polyimide, benzocyclobutene (BCB), polybenzoxazole (PBO), and the like, although other relatively soft, often organic, dielectric materials can also be used. The first passivation layer 12 may be a single layer or a multi-layered structure.

In embodiments, the PPI layer 14 is a metallization structure electrically coupled a metallization layer within the first substrate 10. For example, the PPI layer 14 is formed by initially forming a seed layer (not shown), such as a titanium (Ti) layer, a tantalum (Ta) layer, a tantalum nitride (TaN) layer, a copper (Cu) layer or a Cu alloy layer, and then plating a conductive material layer, such as an aluminum (Al) layer, a Cu layer, a AlCu layer, a gold (Au) layer, or combinations thereof. The pattern of the PPI layer 14 can be defined by a suitable photolithographic mask and etching process. In some embodiments, the PPI layer 14 may also function as power lines, re-distribution lines (RDL), inductors, capacitors or any passive components.

The first protective layer 16 may be formed from a polymer such as polyimide, or may be formed of silicon oxide, silicon nitride, low-k dielectric, extremely low-k dielectric, the like, or a combination thereof. An opening is made through the first protective layer 16 by removing portions of the first protective layer 16 to expose at least a portion of the underlying PPI layer 14. The opening is formed using, for example, a suitable photolithographic mask and etching process.

The bump structure 141 is over the first protective layer 16 and electrically coupled the PPI layer 14 through the opening formed in the first protective layer 16. In embodiments, the bump structure 141 includes an under-bump metallization (UBM) layer 20 in an opening through the first protective layer 16 electrically coupling the PPI layer 14, a metal pillar 22 on the UBM layer 20, a metal cap layer 24 on the metal pillar 22, a metal insertion layer 26 on the metal cap layer 24, and a solder layer 28 on the metal insertion layer 26.

In embodiments, the UBM layer 20 is formed in electrical contact with the PPI layer 14. The UBM layer 20 may be formed of titanium, titanium nitride, tatanium, tatanium nitride, tungsten, titanium tungsten, nickel, gold, chrome, copper, or copper alloy. Any suitable materials or layers of material that may be used for the UBM are fully intended to be included within the scope of the current application. In embodiments, the UBM layer 20 includes a first metallization layer 17 and a second metallization layer 18. For example, the first metallization layer 17 is an adhesion (or a metal barrier) layer formed of titanium or titanium nitride, and the second metallization layer 18 is a seed layer formed of copper. The UBM layer 20 may be created by forming a metallization layer over the first protective layer 16 and in the opening in the first protective layer 16 using, for example, plating, sputtering, evaporation, or PECVD process. Once the metallization layer has been formed, portions of the metallization layer may then be removed through a suitable photolithographic masking and etching process to remove the undesired material and to leave the UBM layer 20 in a desired shape, such as a circular, octagonal, square, or rectangular shape, although any desired shape may alternatively be formed.

The metal pillar 22 is a copper pillar formed on the UBM layer 20 according to some embodiments. The copper pillar is intended to include substantially a material including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and commonly used chemical vapor deposition (CVD) methods. In an exemplary embodiment, the thickness of the metal pillar 22 is greater than about 5 µm. For example, the thickness of the metal pillar 22 is about 8 µm to about 10 µm. In other embodiments, the thickness of the metal pillar 22 is greater than about 10 µm or greater than about 20 µm, although the thickness may be greater or smaller.

The metal cap layer 24 is formed on the top of the metal pillar 22. The metal cap layer 24 may include nickel, tin, tin-lead (SnPb), gold (Au), silver, palladium (Pd), indium (In), nickel-palladium-gold (NiPdAu), nickel-gold (NiAu) or other similar materials or alloy. In an embodiment, the metal cap layer 24 is a nickel layer, an Au layer, or a NiAu layer by plating. In an exemplary embodiment, the thickness of the metal cap layer 24 is about 1 µm to about 5 µm, although the thickness may be greater or smaller.

The metal insertion layer 26 is formed on the top of the metal cap layer 24. In an embodiment, the metal insertion layer 26 is a copper layer. The copper layer is intended to include substantially a layer including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and commonly used chemical vapor deposition (CVD) methods. In an exemplary embodiment, a thickness T1 of the metal insertion layer 26 is equal to or greater than about 1.5 µm, although the thickness may be greater or smaller. For example, the thickness T1 is in the range from about 1.5 µm to about 5 µm.

The solder layer 28 is then formed on the top of the metal insertion layer 26. In embodiments, the solder layer 28 is made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc. Once a solder layer of tin has been formed on the structure, a reflow may be performed in order to shape the solder material into the desired shape.

According to some embodiments, the second die 120 includes a second substrate 30, a second passivation layer 32 covering the second substrate 30, a metal layer 34 formed through an opening in the second passivation layer 32, a second protective layer 36 covering the second passivation layer 32 and a portion of the metal layer 34, and a pad structure 142 over the second protective layer 36 electrically coupling the metal layer 34.

In embodiments, the second passivation layer 32 is formed of a non-organic material selected from un-doped silicate glass (USG), silicon nitride, silicon oxynitride, silicon oxide, and combinations thereof. In other embodiments, the second passivation layer 32 is formed of a polymer layer, such as an epoxy, polyimide, benzocyclobutene (BCB), polybenzoxazole (PBO), and the like, although other relatively soft, often organic, dielectric materials can also be used. The second passivation layer 32 may be a single layer or a multi-layered structure.

In embodiments, the metal layer 34 is a portion of conductive routes and has an exposed surface not covered by the second protective layer 36. The metal layer 34 is a top-level metal layer of an interconnect structure formed on the second substrate 30 according to some embodiments. Suitable materials for the metal layer 34 may include, but are not limited to, for example copper, aluminum, copper alloy, aluminum alloy, or other mobile conductive materials, although it may also be formed of, or include, other materials such as copper, silver, gold, nickel, tungsten, alloys thereof, and/or multi-layers thereof.

In embodiments, the pad structure 142 is formed over the second protective layer 36 and the exposed surface of the metal layer 34. In an embodiment, the pad structure 142 is formed of a conductive material which does not include copper. In embodiments, the pad structure 142 includes nickel (Ni), tin, tin-lead (SnPb), gold (Au), silver, palladium (Pd), indium (In), nickel-palladium-gold (NiPdAu), nickel-gold (NiAu), a Ni-based alloy, an Au-based alloy, a Pd-based alloy, or other similar materials by an electroless plating process or an immersion plating process. The pad structure 142 has a thickness T2 about 1 µm to about 10 µm. In an embodiment, the pad structure 142 is a triple-layer structure including an electroless Ni layer, an electroless Pd layer, and an immersion Au layer, which is also known as an ENEPIG structure. For example, the ENEPIG structure may have the electroless Ni layer with a thickness of at least 1 µm, the electroless Pd layer with a thickness of at least 0.02 µm and the immersion Au layer with a thickness of at least 0.01 µm. In an embodiment, the pad structure 142 is a dual-layer structure including an electroless Ni layer and an electroless Pd layer, named an ENEP structure. In an embodiment, the pad structure 142 is a single-layer structure including an electroless Ni layer, which is also known as an EN structure. In an embodiment, the pad structure 142 is a dual-layer structure including an electroless Ni layer and an immersion Au layer, which is also known as an ENIG structure.

Once the bump structure 141 is formed on the first die 110 and the pad structure 142 is formed on the second die 120, the first die 110 is attached to the second die 120, such as by bonding the bump structure 141 and the pad structure 142. In an embodiment, the solder layer 28 is reflowed and bonded to the pad structure 142 form a permanent connection between the first die 110 and the second die 120, thus forming the first connector 140 as illustrate in FIG. 1.

FIG. 3 illustrates an example of the formation of the first connector 140 shown in FIG. 1. The structures of FIG. 2 are brought together and the solder layer 28 and the pad structure 142 are bonded, such that the solder layer 28 becomes a solder joint portion 50 between the metal insertion layer 26 and the pad structure 142. A height of the first connector 140 between the first die 110 and the second die 120 can be between approximately 20 µm and approximately 30 micrometers.

During thermal cycling, the tin in the solder joint portion 50 tends to migrate through cracks or other defects and react with the underlying layer (such as the metal insertion layer 26) to form an intermetallic compound (IMC) layer, and the metal insertion layer 26 may be consumed during the IMC formation. FIG. 4 illustrates an example of the formation of IMC layers in the first connector 140 shown in FIG. 3. In some embodiments, an IMC layer 52 is formed at the interface between the metal insertion layer 26 and the solder joint portion 50. In embodiments, the IMC layer 52A includes $Cu_6Sn_5$, $(Cu, Pd, Au)_6Sn_5$, $(Cu, Pd)_6Sn_5$, $(Cu, Au)_6Sn_5$ and/or $Cu_3Sn$, $(Cu, Pd, Au)_3Sn$, $(Cu, Pd)_3Sn$, $(Cu, Au)_3Sn$. In an exemplary embodiment, a thickness T3 of the IMC layer 52 is between about 3 µm and about 5 µm, although the thickness may be greater or smaller. In the first connector 140, the metal insertion layer 26 can reduce solder source and interrupt the path of solder diffusion. It is experimentally observed that the IMC growth rate of $Cu_6Sn_5$ and $Cu_3Sn$ is three times faster than that of $Ni_3Sn_4$. Thereby, no solder wetting is observed on sidewalls of the metal pillar and void formation in the solder joint portion is minimized and/or eliminated. The device performance can be significantly improved by void reduction in the solder joint portion, and the improvements are observed in reliability testing, such as TCT (temperature cycling test) and HTS (high temperature storage) test.

An embodiment is an integrated circuit structure including a first die having a bump structure, and a second die having a pad structure. The first die is attached to the second die by bonding the bump structure and the pad structure. The bump structure includes a metal pillar, a metal cap layer on the metal pillar, a metal insertion layer on the metal cap layer, and a solder layer on the metal insertion layer. The pad structure includes at least one of a nickel (Ni) layer, a palladium (Pd) layer or a gold (Au) layer.

Another embodiment is an integrated circuit structure including a first die attached to a second die by a first connector. The first connector includes a solder joint portion between a nickel layer and a pad structure, and a copper layer between the nickel layer and the solder joint portion. The pad structure includes at least one of a nickel (Ni) layer, a palladium (Pd) layer or a gold (Au) layer.

A further embodiment is an integrated circuit structure including a first die attached to a second die through a first connector, and a workpiece attached to the second die through a second connector. The first connector includes a copper layer between a copper pillar and a pad structure, a nickel layer between the copper pillar and the copper layer, a solder layer between the copper layer and the pad structure, and an intermetallic compound (IMC) layer between the copper layer and the solder layer. The pad structure includes at least one of a nickel (Ni) layer, a palladium (Pd) layer or a gold (Au) layer.

Although the present embodiments and their advantages have been described in detail, it should be understood that various changes, substitutions and alterations can be made herein without departing from the spirit and scope of the disclosure as defined by the appended claims. For example, although the foregoing embodiments were discussed with respect to structures comprising two dies, embodiments can have any number of dies with any combination of connectors attaching those dies.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated circuit structure comprising:
   a first die comprising a bump structure; and
   a second die comprising a pad structure comprising at least one of a nickel (Ni) layer, a palladium (Pd) layer or a gold (Au) layer;
   wherein the first die is attached to the second die by the bump structure being attached to the pad structure; and
   wherein the bump structure comprises:

a metal pillar comprising copper;
a metal cap layer comprising nickel on the metal pillar, the metal cap layer having a first side facing away from the metal pillar;
a metal insertion layer comprising copper on the metal cap layer, the metal insertion layer completely covering the first side of the metal cap layer, the metal cap layer being disposed between the metal pillar and the metal insertion layer;
a solder layer on the metal insertion layer; and
an intermetallic compound (IMC) disposed between the solder layer and the metal insertion layer, the IMC comprising copper (Cu) and being substantially free of nickel (Ni).

2. The integrated circuit structure of claim 1, wherein the pad structure comprises an electroless Ni layer, an electroless Pd layer and an immersion Au layer.

3. The integrated circuit structure of claim 1, wherein the first die is an active die, and the second die is an interposer free of active devices.

4. The integrated circuit structure of claim 1, wherein the second die comprises a through substrate via.

5. The integrated circuit structure of claim 1, further comprising a workpiece electrically coupling the second die through a plurality of connectors.

6. The integrated circuit structure of claim 1, wherein the second die comprises a metal layer comprising copper and underlying the pad structure.

7. The integrated circuit structure of claim 1, wherein the first die comprises a post-passivation interconnect (PPI) layer underlying the bump structure.

8. The integrated circuit structure of claim 1, wherein the solder layer is a lead-free solder layer.

9. An integrated circuit structure comprising:
a first die attached to a second die by a first connector, wherein the first connector comprises:
    a solder joint portion between a nickel layer and a pad structure;
    a copper layer between the nickel layer and the solder joint portion; and
    an intermetallic compound (IMC) comprising copper (Cu) between the solder joint portion and the copper layer, the IMC being substantially free of nickel (Ni), the copper layer completely separating the IMC from the nickel layer; and
wherein the pad structure comprises at least one of a nickel (Ni) layer, a palladium (Pd) layer or a gold (Au) layer.

10. The integrated circuit structure of claim 9, wherein the solder joint portion comprises a lead-free solder material.

11. The integrated circuit structure of claim 9, wherein the first connector comprises a copper pillar on a first substrate of the first die, and wherein the nickel layer is between the copper pillar and the copper layer.

12. The integrated circuit structure of claim 9, wherein the second die comprises a metal layer comprising copper on a second substrate, and the pad structure is formed on the metal layer.

13. The integrated circuit structure of claim 9, wherein the first die is an active die, and the second die is an interposer free of active devices.

14. The integrated circuit structure of claim 9, wherein the second die comprises a through substrate via.

15. The integrated circuit structure of claim 9, further comprising a workpiece electrically coupling the second die through a plurality of second connectors.

16. A method of forming an integrated circuit structure comprising:
forming on a first die a bump structure including:
    forming on a surface of the first die a metal pillar comprising copper;
    forming on the metal pillar a metal cap layer comprising nickel;
    forming on the metal cap layer a metal insertion layer comprising copper; and
    forming on the metal insertion layer a solder layer;
forming on a second die a pad structure by forming at least one of a nickel (Ni) layer, a palladium (Pd) layer and a gold (Au) layer;
forming an intermetallic compound (IMC) comprising copper (Cu) between the solder layer and the metal insertion layer, the IMC being substantially free of Ni; and
bonding the bump structure to the pad structure, at least a portion of the metal insertion layer contacting a center of a first surface of the metal cap layer facing the pad structure after the bonding, and the IMC being between the solder layer and the metal insertion layer after the bonding.

17. The method of claim 16, wherein forming a pad structure comprises at least one of electroless plating Ni, electroless plating Pd, or an immersion Au process.

18. The integrated circuit structure of claim 1, wherein the IMC has a thickness between about 3 µm and about 5 µm.

19. The integrated circuit structure of claim 9, wherein the IMC has a thickness between about 3 µm and about 5 µm.

20. The method of claim 16, wherein metal insertion layer has a thickness greater than about 1.5 µm.

* * * * *